(12) United States Patent
Tokuhiro et al.

(10) Patent No.: US 7,362,127 B2
(45) Date of Patent: Apr. 22, 2008

(54) DRIVER CIRCUIT

(75) Inventors: Noriyuki Tokuhiro, Kawasaki (JP);
Kunihiro Itoh, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/986,154

(22) Filed: Nov. 12, 2004

(65) Prior Publication Data

US 2006/0022713 A1    Feb. 2, 2006

(30) Foreign Application Priority Data

Jul. 29, 2004    (JP) .............................. 2004-221674

(51) Int. Cl.
*H03K 19/003* (2006.01)
(52) U.S. Cl. .......................................... 326/30; 326/87
(58) Field of Classification Search ................... 326/30
See application file for complete search history.

(56) References Cited

U.S. PATENT DOCUMENTS

| | | | | |
|---|---|---|---|---|
| 5,764,589 | A | * | 6/1998 | Lotfi ..................... 365/230.06 |
| 5,949,268 | A | * | 9/1999 | Miura et al. ................. 327/278 |
| 6,087,847 | A | * | 7/2000 | Mooney et al. ............... 326/30 |
| 6,578,156 | B1 | | 6/2003 | Sugita |
| 6,586,964 | B1 | * | 7/2003 | Kent et al. ..................... 326/30 |
| 6,636,069 | B1 | | 10/2003 | Muljono |
| 2002/0030523 | A1 | | 3/2002 | Muljono et al. |
| 2003/0137326 | A1 | | 7/2003 | Okada |

FOREIGN PATENT DOCUMENTS

| | | |
|---|---|---|
| JP | 2001-196916 | 7/2001 |
| JP | 2002-190729 | 7/2002 |
| JP | 2003-218689 | 7/2003 |

OTHER PUBLICATIONS

Search Report for corresponding European Appln. No. 04026767.6 dated Nov. 20, 2005.
Office Action for corresponding European Application No. 04 026 767.6 dated Aug. 24, 2006.

* cited by examiner

*Primary Examiner*—James H. Cho
(74) *Attorney, Agent, or Firm*—Staas & Halsey LLP

(57) ABSTRACT

A driver circuit for driving a device or circuit disposed after it comprises a plurality of driving transistors connected in parallel, a selection unit for selecting one or more groups from a plurality of groups to each of which driving transistors having a power base of two with the same polarity belong and in which the number of driving transistors belonging to each group is different and a driving unit for driving driving transistors belonging to the group selected by the selection unit.

9 Claims, 4 Drawing Sheets

DRIVER CIRCUIT

BACKGROUND OF THE INVENTION

1. Field of the Invention

The present invention relates to a technology used for a driver circuit provided in the output stage of an interface unit transmitting signals to the device/circuit disposed after the driver circuit for driving the device/circuit, more particularly to a technology of a driver circuit, capable of adjusting the driving capacity of the device/circuit disposed after the driver circuit.

2. Description of the Related Art

As a device whose driving capacity must be adjusted by the driver device, there is, for example, a memory interface based on the DDR2 (double data rate 2) rating stipulated by JEDEC (Joint Electron Device Engineering Council).

The adjustment of the driving capacity of a driver circuit in the memory interface is described with reference to FIG. 1. In this memory interface, four bits of control signal is inputted to both the power supply side (P-channel type metal oxide semiconductor (MOS) transistor side) and ground side (N-channel type MOS transistor side) of a driver circuit 101 for driving memory 200 provided for a controller 100, and it is required that the driving capacity can be adjusted by the four bits (at 16 steps).

One configuration of the conventional driver circuit capable of adjusting such a driving capacity is shown in FIG. 2.

In this configuration, n sets of a pairs of two P-channel type MOS transistors whose source terminal and drain terminal are connected in series are provided between a power supply line 110 and an output signal line 130. Furthermore, n sets of a pair of two N-channel type MOS transistors whose source terminal and drain terminal are connected in series are provided between a ground line 120 and an output signal line 130.

A signal input line 140 is connected to the input terminal of a pre-driver 150, and the output of the pre-driver 150 is commonly connected to all the gate terminals of both the P-channel type MOS transistors (hereinafter simply called "P type transistor") 111-1, 111-2, . . . , 111-n and the N-channel type MOS transistors (hereinafter simply called "N type transistor") 121-1, 121-2, . . . , 121-n. Therefore, the pre-driver 150 collectively controls the on/off of each of these MOS transistors (hereinafter simply called "transistor") according to the theory of a digital signal (transmission signal) inputted to the signal input line 140.

A control signal for adjusting the driving capacity on the power supply side of the driver circuit 101 is connected to the gate terminal of each of the P-type transistors 112-1, 112-2, . . . , 112-n through a power supply side control signal line 170, and a control signal for adjusting the driving capacity on the ground side of the driver circuit 101 is connected to the gate terminal of each of the N-type transistors 122-1, 122-2, . . . , 122-n through a ground side control signal line 180. The on/off of these transistors is controlled based on a control signal inputted to the power supply side control signal line 170 or the ground side control signal line 180.

In this case, the number of transistors simultaneously switched on by this control signal is set based on the value (one value in 16 steps) of the control signal. Since by doing so, the number of transistors engaged in the driving of the memory 200 connected to the output signal line 130 can be controlled by the value of this control signal, the driving capacity of the driver circuit 101 can be adjusted.

A technology for forming a driver circuit for providing P-type and N-type transistors between the power line and the output signal line and between the ground line and the output signal line is disclosed in Japanese Patent Application Nos. 2003-218689, 2001-196916 and 2002-190729.

In FIG. 2, since a pair of two P-type transistors connected in series and a pair of two N-type transistors connected in series must be arrayed in parallel, a lot of transistors are needed to form the driver circuit 101. Therefore, a wide area is needed to form the driver circuit 101 on a semiconductor substrate.

If the control signal for designating the driving capacity of the driver circuit 101 is given as parallel data, a circuit for converting the parallel data to generate a signal to be applied to each gate terminal of the P-type transistors 112-1, 112-2, . . . , 112-n and the N-type transistors 122-1, 122-2, . . . , 122-n is also needed.

SUMMARY OF THE INVENTION

It is an object of the present invention to adjust the driving capacity of a small-scale driver circuit.

A driver circuit in one aspect of the present invention comprises a plurality of driving transistors connected in parallel, a selection unit for selecting one or more groups from a plurality of transistor groups to each of which driving transistors having a power base of two with the same polarity belong, and in which the respective number of the driving transistors belonging to each group is different, and a driving unit for driving driving transistors belonging to the group selected by the selection unit.

According to this configuration, by controlling and modifying the selection of one or more of the groups, the number of driving transistors engaged in the driving of another device can be increased or reduced. Therefore, the driving capacity of a driving circuit can be changed.

In the driver circuit of the present invention, the above-mentioned driving transistors are P-channel type MOS transistors connected in parallel between the power supply line and the output signal line, and N-channel type MOS transistors connected in parallel between the ground line and the output signal line. The P-channel type and N-channel type MOS transistors can also be formed to match the respective driving resistance values.

Thus, physical connection around a driving transistor on a semiconductor substrate can be simplified.

In the above-mentioned driver circuit of the present invention, each driving transistor can also be individually provided with the driving unit.

Thus, the output slew rate of the driver circuit can be improved.

The above-mentioned driver circuit of the present invention can also further comprise an offset driving unit for driving driving transistors belonging to none of the groups.

According to this configuration, the changing range of the driving capacity of the driver circuit can be shifted.

The present invention also includes a semiconductor device in which the above-mentioned driver circuit of the present invention is formed on a single semiconductor substrate.

In this semiconductor device, the change linearity of the driving capacity of the driver circuit can be improved.

The present invention also includes a semiconductor device in which the above-mentioned driver circuit of the present invention is formed on a single semiconductor substrate and the respective driving resistance values of the above-mentioned P-channel type and N-channel type MOS transistors are made the same by differentiating their respective size on the semiconductor substrate.

According to this semiconductor device, physical connection around the driving transistor on a semiconductor substrate can be made simplified.

The present invention also includes an electronic device including the above-mentioned semiconductor device of the present invention.

As described above, according to the present invention, the driving capacity of a small-scale driver circuit can be adjusted.

BRIEF DESCRIPTION OF THE DRAWINGS

The present invention will be more apparent from the following detailed description when the accompanying drawings are referenced, in which FIG. 1 explains the adjustment of the driving capacity of a driver circuit in a memory interface.

DESCRIPTION OF THE PREFERRED EMBODIMENTS

The preferred embodiments of the present invention are described below with reference to the drawings.

Figure 1:
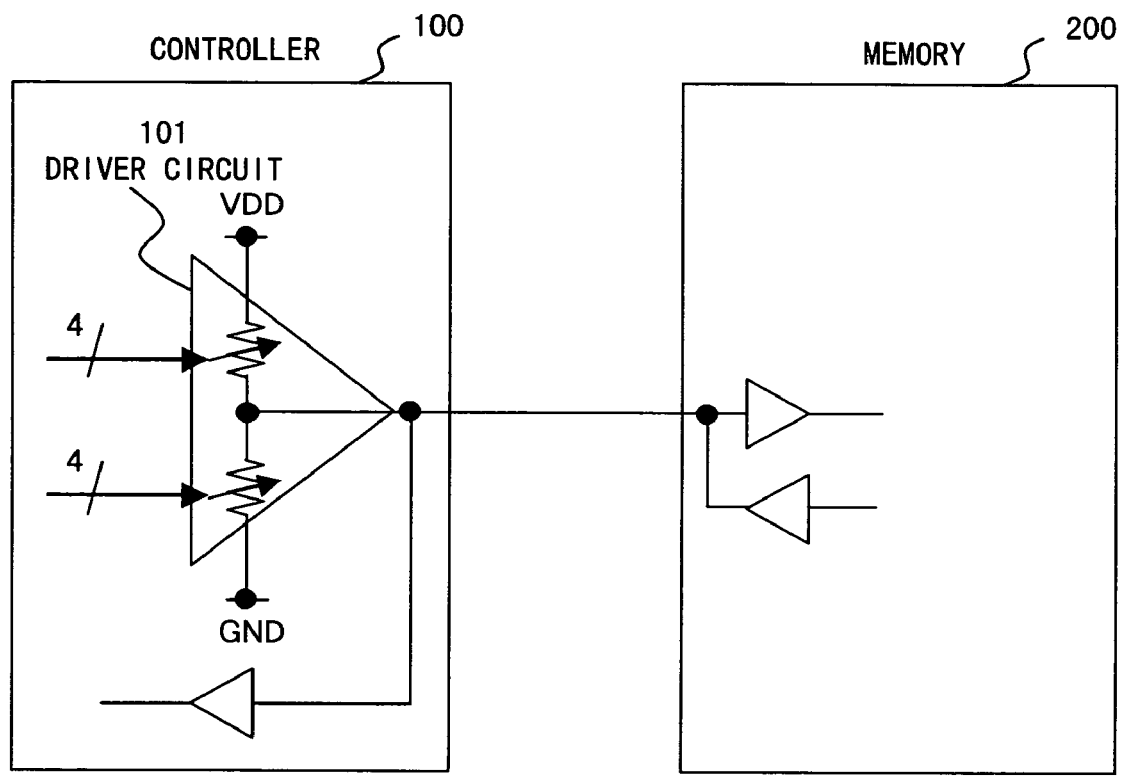
Figure 2:
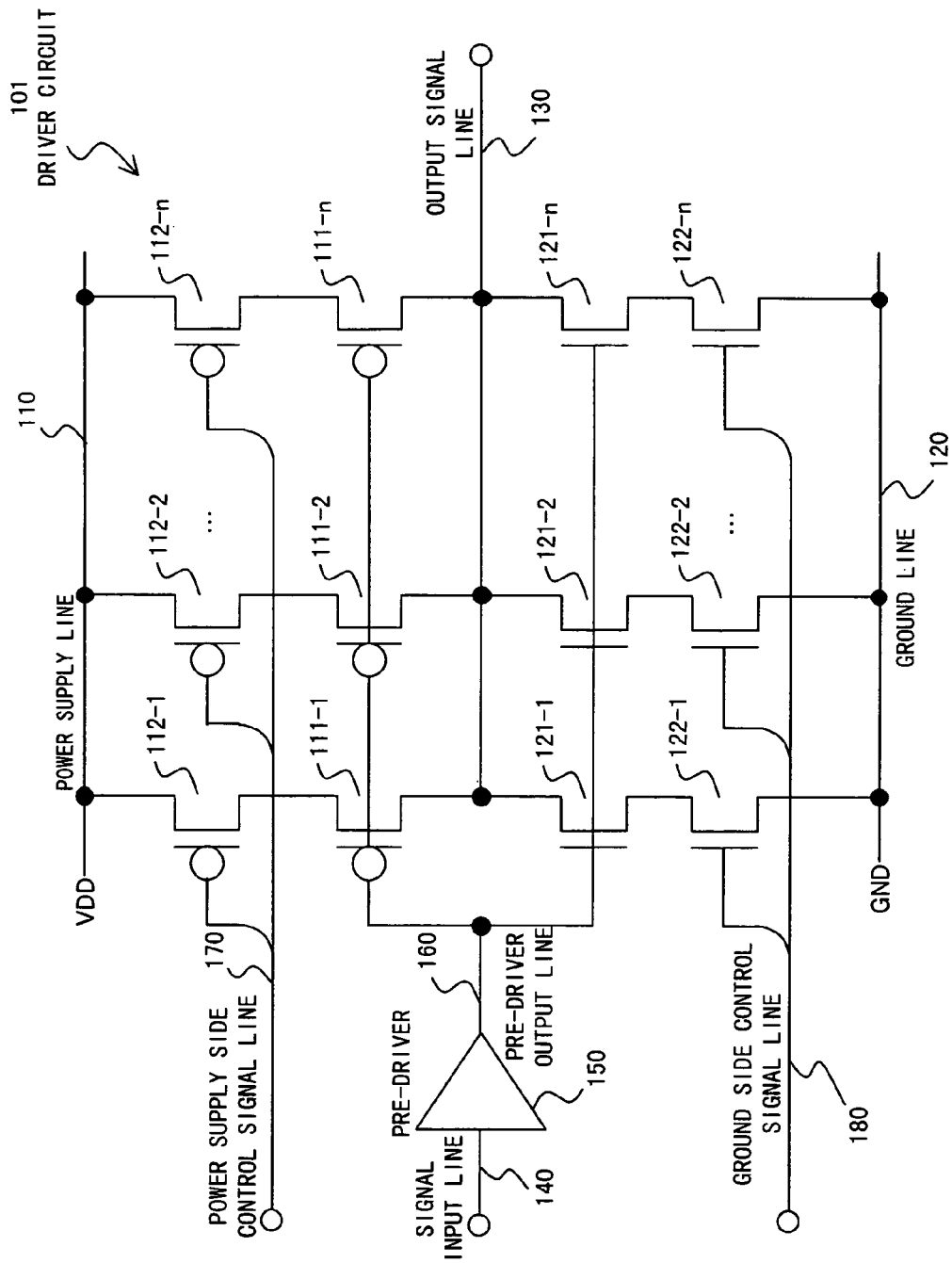
FIG. 2 shows the configuration of a driver circuit capable of adjusting driving capacity.
Figure 3:
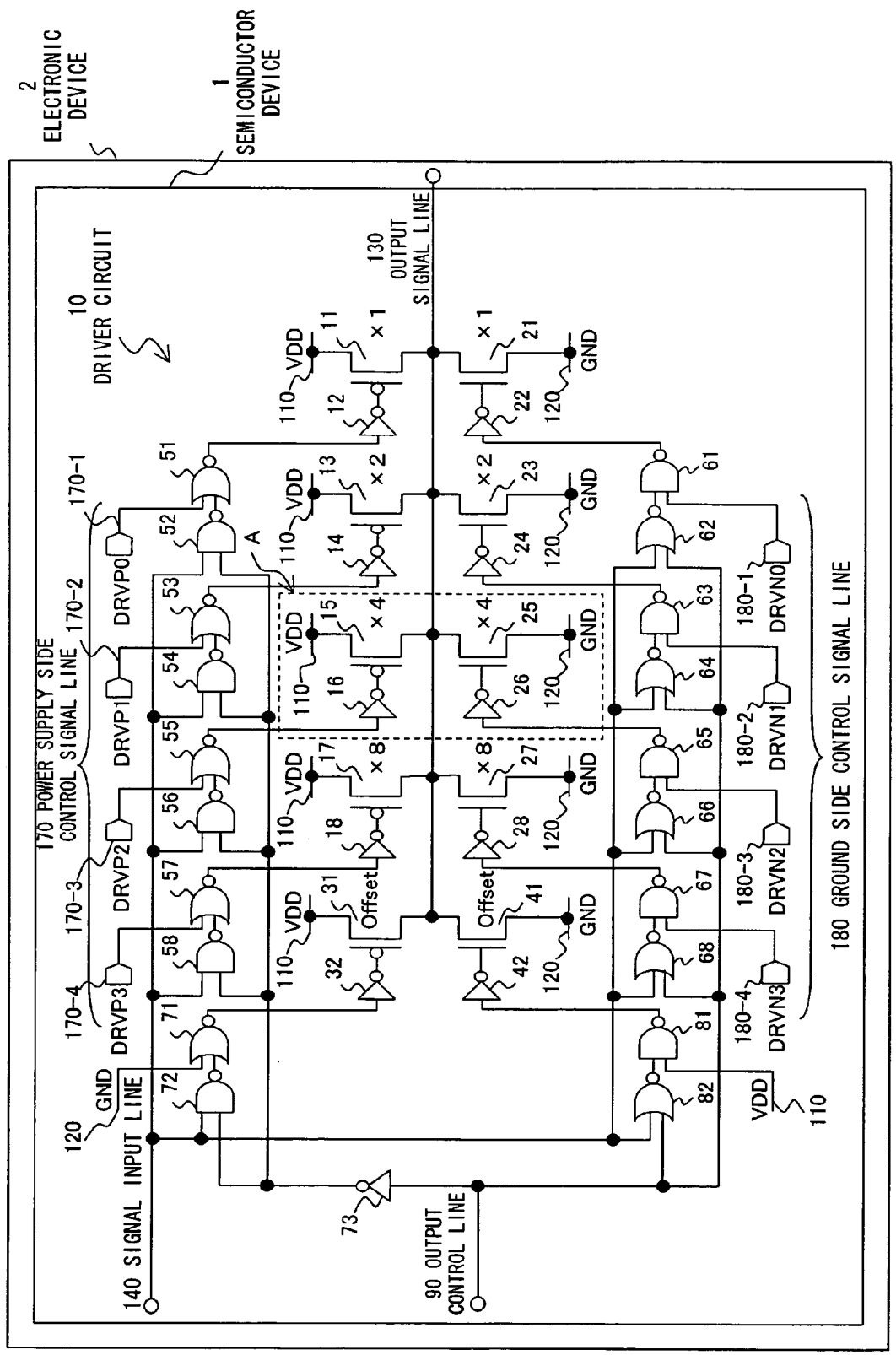
FIG. 3 shows the configuration of the driver circuit implementing the present invention.

FIG. 3 shows the configuration of a driver circuit 10 implementing the present invention. In FIG. 3, the same reference numerals are attached to the same lines as in FIG. 2.

In this preferred embodiment, this driver circuit 10 is formed on a single semiconductor substrate in a semiconductor device 1. This semiconductor device 1 is, for example, a central processing unit (CPU), and is installed, for example, in an electric device 2, such as a computer or the like.

In FIG. 3, P-type transistors 11, 13, 15, 17 and 31 and N-type transistors 21, 23, 25, 27 and 41 drive another device (for example, semiconductor memory) connected to an output signal line 130 in the semiconductor device 1.

In FIG. 3, characters "×1", "×2", "×4" and "×8" attached to the right side of each symbol of the P-type transistors 11, 13, 15 and 17 and N-type transistors 21, 23, 25 and 27 of these driving transistors indicate the number of the combinations of a driving transistor and a pre-driver, composed of each of these driving transistors and each of pre-drivers 12, 14, 16, 18, 22, 24, 26 and 28, which are inverters individually connected to and installed in the gate terminal of each of the driving transistors.

Figure 4:
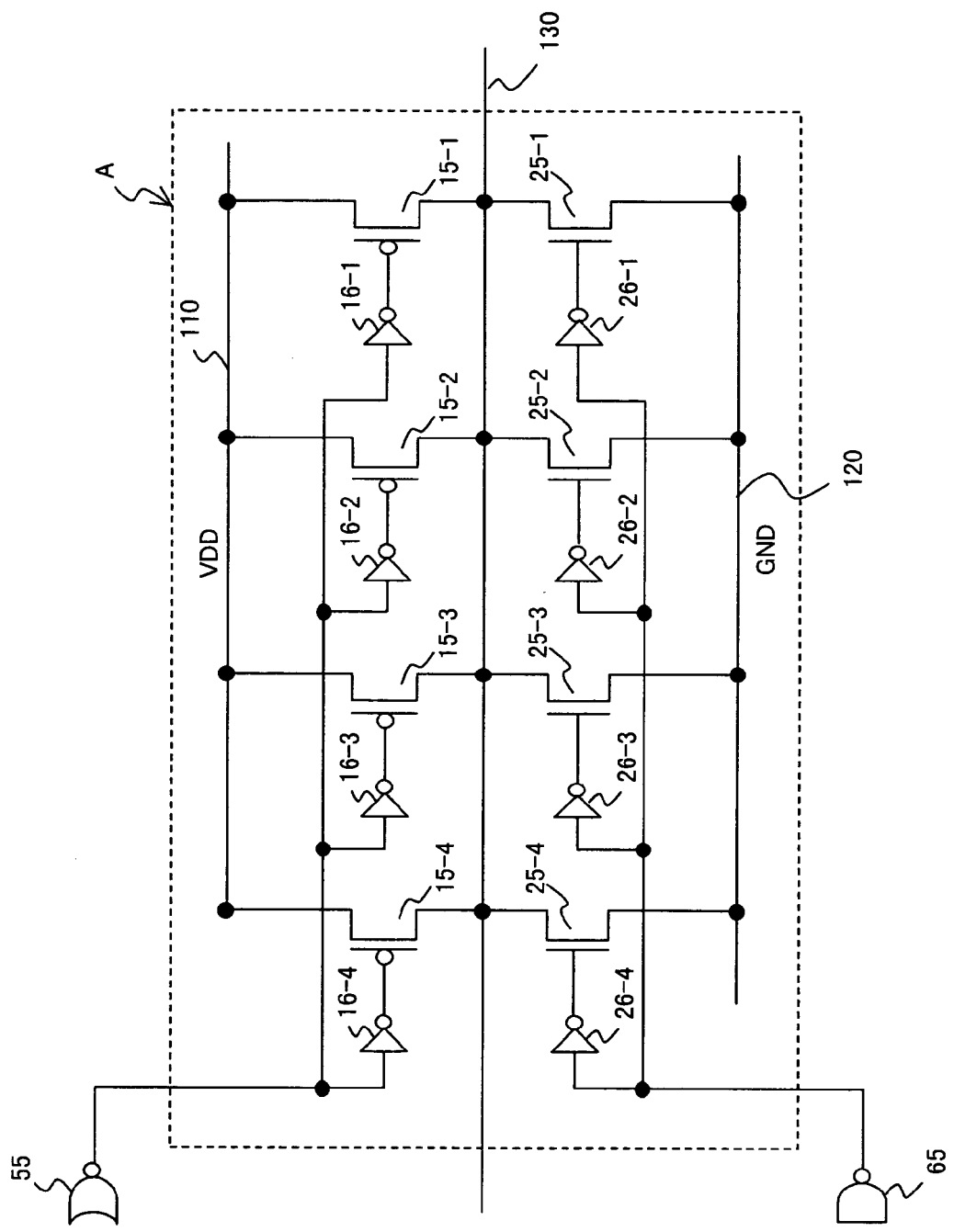
FIG. 4 shows the detailed configuration of a part "A" shown in FIG. 3.

Here, FIG. 4 is described. FIG. 4 shows the detailed configuration of a part "A", which is enclosed by a broken line in FIG. 3. The meaning of the characters is described with reference to FIG. 4.

In FIG. 3, a character "×4" is attached to the right side of each of the P-type transistor 15 and N-type transistor 25 included in the part "A". This means that four combinations of a P-type transistor 15 and a pre-driver 16, which is a driving unit for individually driving the P-type transistor 15, and four combinations of the N-type transistor 25 and a pre-driver 26, which is a driving unit for individually driving the N-type transistor 25, are provided. Specifically, the combination in FIG. 3 of the P-type transistor 15 and the pre-driver 16 represents the four combinations in FIG. 4 of a P-type transistor 15-1 and a pre-driver 16-1, a P-type transistor 15-2 and a pre-driver 16-2, a P-type transistor 15-3 and a pre-driver 16-3 and a P-type transistor 15-4 and a pre-driver 16-4. The combination in FIG. 3 of the N-type transistor 25 and the pre-driver 26 represents the four combinations in FIG. 4 of a N-type transistor 25-1 and a pre-driver 26-1, a N-type transistor 25-2 and a pre-driver 26-2, a N-type transistor 25-3 and a pre-driver 26-3 and a N-type transistor 25-4 and a pre-driver 26-4.

In this case, the P-type transistors 11, 13, 15, 17 and 31 are connected in parallel between a gate terminal and a source terminal, and the N-type transistors 21, 23, 25, 27 and 41 are also connected in parallel between the gate terminal and the source terminal.

In FIG. 4, all the drain terminals of the P-type transistors 15-1, 15-2, 15-3 and 15-4 are commonly connected to the power supply line 110, and all their source terminals are commonly connected to the output signal line 130. Therefore, in the P-type transistor 15, the P-type transistors 15-1, 15-2, 15-3 and 15-4 are all connected in parallel between the power supply line 110 and the output signal line 130. The same connection also applies to each of the P-type transistors 11, 13, 17 and 31, outside the part "A".

Furthermore, as shown in FIG. 4, all the drain terminals of the N-type transistors 25-1, 25-2, 25-3 and 25-4 are commonly connected to the output signal line 130, and all their source terminals are commonly connected to the ground line 120. Therefore, in the N-type transistor 25, the N-type transistors 25-1, 25-2, 25-3 and 25-4 are all connected in parallel between the ground line 120 and the output signal line 130. The same connection also applies to each the N-type transistors 21, 23, 27 and 41, outside the part "A".

The respective inputs of the pre-drivers 16-1, 16-2, 16-3 and 16-4 shown in FIG. 4 are commonly connected to the output of a NOR gate 55. Therefore, the on/off of the P-type transistors 15-1, 15-2, 15-3 and 15-4 is commonly controlled by the output of the NOR gate 55. The respective inputs of the pre-drivers 26-1, 26-2, 26-3 and 26-4 shown in FIG. 4 are commonly connected to the output of a NAND gate 65. Therefore, the on/off of the N-type transistors 25-1, 25-2, 25-3 and 25-4 is commonly controlled by the output of the NAND gate 65.

The meaning of the characters "×1", "×2" and "×8" is similar to the character "×4", and one, two and eight combinations, respectively, of a driving transistor and a pre-driver in each of which the same connection as in FIG. 4 is made, are provided. In other words, each of the P-type transistors 11, 13, 15, 17 and the N-type transistors 21, 23, 25 and 27 represents each group of driving transistors composed of a power base of two (that is, $2^0$, $2^1$, $2^2$, $2^3$) driving transistors with the same polarity (P-type or N-type). In this case, the respective number of driving transistors belonging to each group is different.

In FIG. 3, a character "offset" is attached to the right side of each symbol of the P-type transistor 31 and N-type transistor 41. This character indicates the number of combinations of a driving transistor and a pre-driver, that is, of a driving transistor (p-type transistor 31 or N-type transistor 41) for driving another device connected to the output signal line 130 regardless of the respective high/low signal level of the power supply side control signal line 170 and ground side control signal 180, and an inverter (pre-driver 32 or 42), which is an offset driving unit for individually driving the driving transistor, which is described in detail later. In FIG. 3, although the same character "offset" is also attached to the right side of each symbol of the P-type transistor 31 and the N-type transistor 41, in this case, the character does not always indicate the number of the same combinations.

In this case, the respective driving resistance values of P-type and N-type transistors, being driving transistors, are made the same. In this preferred embodiment, the respective gate width on a semiconductor substrate of P-type and N-type transistors are different according to its characteristic. The driving resistance value of each driving transistor is the same. In this preferred embodiment, each driving transistor with the same polarity is formed on a single semiconductor substrate, and furthermore, their shape/size are made the same. In this case, if driving transistors with the same polarity are closely disposed, their driving resistance values can be easily made the same.

The output control line 90 shown in FIG. 3 is provided to control the try state of the output signal line 130.

In FIG. 3, if the signal level of the output control line 90 is shifted from an L level (low level) to an H level (high level), the respective outputs of NAND gates 52, 54, 56, 58 and 72 connected to each other through an inverter 73 become always H regardless of the high/low signal level of a signal input line 140. Therefore, the respective outputs of NOR gates 51, 53, 55, 57 and 71 always become L. As a result, the respective outputs of pre-drivers 12, 14, 16, 18 and 32 to which the output is inputted, that is, the signal levels of each gate terminal of the P-type transistors 11, 13, 15, 17 and 31 all become H. In this case, since the respective outputs of NOR gates 62, 64, 66, 68 and 82 to which the output control line 90 is directly connected all always become L, the respective outputs of NAND gates 61, 63, 65, 67 and 81 all always become H. As a result, the respective outputs of pre-drivers 22, 24, 26, 28 and 42 to which the output is inputted, that is, the signal level of each gate terminal of the N-type transistors 21, 23, 25, 27 and 41 all become L.

Therefore, in this case, the P-type transistors 11, 13, 15, 17 and 31 and the N-type transistors 21, 23, 25, 27 and 41 are all switched off. Therefore, the output signal line 130 enters into a try state (high-impedance state).

In the following description, it is assumed the signal level of the output signal line 90 is maintained at L.

If the level of a signal inputted to the signal input line 140 is H, the respective outputs of the NOR gates 62, 64, 66, 68 and 82 all become L. In this case, the respective outputs of the NAND gates 61, 63, 65, 67 and 81 all become H. As a result, the N-type transistors 21, 23, 25, 27 and 41 are all switched off. However, in this case, since the respective outputs of the NAND gates 52, 54, 56, 58 and 72 all become L, the on/off of each of the P-type transistors 11, 13, 15, 17 and 31 is determined by the high/low input signal on the side to which the outputs of the NAND gates 52, 54, 56, 58 and 72 of the inputs of the NOR gates 51, 53, 55, 57 and 71 are not connected.

In this case, the input of the NOR gate 71 on the side to which the output of the NAND gate 72 is not connected is connected to the ground line 120. Therefore, an L signal level is added to the input of the NOR gate 71. In this case, since the P-type transistor 31 is switched on, the number of P-type transistors (driving transistors) indicated by a character "offset" belonging to none of the groups indicated by the P-type transistors 11, 13, 15 and 17 are engaged in the driving of another device connected to the output signal line 130.

A control signal for designating the driving capacity of the driver circuit 10 is given to the input on the side to which the outputs of the NAND 52, 54, 56 and 58 of the e inputs of the NOR gates 51, 53, 55 and 57 are not connected, as four binary bits of parallel data.

For example, if this control signal is binary four bits of parallel data "1101" (that is, 13 in decimal 16 steps), signal levels of L, L, H and L are given to power supply side control signal lines 170-4, 170-3, 170-2 ad 170-1, respectively. In this case, the P-type transistors 17, 15 and 11 are switched on, and the P-type transistor 13 is switched off.

In this case, as described above, the P-type transistor 17 in FIG. 3 is substantially a group of eight P-type transistors, the P-type transistor 15 is substantially a group of four P-type transistors, and the P-type transistor 11 is substantially a group of one P-type transistor. Therefore, the 13 P-type transistors in total belonging to these groups selected by the NOR 51, 53, 55 and 57, based on a control signal and the number of P-type transistors indicated by the above-mentioned character "offset" are engaged in the driving of another device connected to the output signal line 130.

In this case, for example, if this control signal is changed to binary four bits of parallel data "0110" (that is 6 in the decimal 16 steps), signal levels of H, L, L and H are given to the power side control signal lines 170-4, 170-3, 170-2 and 170-1, respectively. Then, in this case, the P-type transistors 15 and 13 are switched on, and those 17 and 11 are switched off.

In this case, the P-type transistor 15 shown in FIG. 3 is substantially a group of four P-type transistors, and the P-type transistor 13 is substantially a group of two P-type transistors. Therefore, both six P-type transistors in total belonging to these groups selected based on the NOR gates 51, 53, 55 and 57, and the number of P-type transistors indicted by the above-mentioned character "offset" are engaged in the driving of another device connected to the output signal line 130.

As describe above, in the driver circuit 10 shown in FIG. 3, if the control signal designated by the driving capacity given as binary four bits of parallel data when the level of a signal inputted to the signal input line 140 is H is modified, the number of P-type transistors engaged in the driving of another device connected to the output signal line 130 increases/decreases according to the modification of the control signal. Accordingly, the driving capacity of the driver circuit 10 can be changed. In this case, the number of P-type transistors indicated by the character "offset" has the effect of providing the driving capacity of the driver circuit 10 with offset (shifting the changing range of the driving capacity).

Although so far the operation in the case where the level of a signal inputted to the signal input line 140 is H has been described, the operation in the case where it is L is similar to the above-mentioned one.

If the level of a signal inputted to the signal input line 140 is L, the respective outputs of the NAND gates 52, 54, 56, 58 and 72 all become H. Then, in this case, the respective outputs of the NOR gates 51, 53, 55, 57 and 71 all become L. As a result, the P-type transistors 11, 13, 15, 17 and 31 are all switched off. However, since in this case, the respective outputs of the NOR gates 62, 64, 66, 68 and 82 all become H, the respective on/off of the N-type transistors 21, 23, 25, 27 and 41 are all determined by the high/low signal level of the input of the side to which the outputs of the NOR gates 62, 64, 66, 68 and 82 of the inputs of the NAND gates 61, 63, 65, 67 and 81 are not connected.

In this case, the input of the NAND gate on the side to which the output of the NOR gate 82 is not connected is connected to the power supply line 110. Therefore, in this case, an H signal level is applied to the input of the NAND gate 81. In this case, since the N-type transistor 41 is switched on, the number of N-type transistors (driving transistors) indicated by the character "offset", belonging to none of the groups indicated by the N-type transistors 21, 23, 25 and 27 are engaged in the driving of another device connected to the output signal line 130.

A control signal for designating the driving capacity of the driver circuit 10 is given to the input of the side to which the outputs of the NOR gates 62, 64, 66 and 68 of the inputs of the NAND gates 61, 63, 65 and 67 are not connected.

For example, if this control signal is binary four bits of parallel data (that is, 13 in decimal 16 steps) "1101", signal levels of H, H, L and H are given to ground side control signal lines 180-4, 180-3, 180-2 and 180-1, respectively. Then, in this case, the N-type transistors 27, 25 and 21 are switched on, and the N-type transistor 23 is switched off.

In this case, as described above, the N-type transistor 27 shown in FIG. 3 is substantially a group of eight N-type transistors, and the N-type transistor 25 is substantially a group of four N-type transistors. Therefore, both the 13 N-type transistors in total belonging these groups selected by the NAND gates 61, 63, 65 and 67 based on the control signal and the number of N-type transistors indicated by the above-mentioned character "offset" are engaged in the driving of another device connected to the output signal line 130.

In this case, for example, if this control signal is changed to binary four bits of parallel data "0110" (that is, 6 in the decimal 16 steps), signal levels of L, H, H and L are given to the ground side control signal lines 180-4, 180-3, 180-2 and 180-1, respectively. Then, in this case, the N-type transistors 25 and 23 are switched on, and those 27 and 21 are switched off.

In this case, the N-type transistor 25 shown in FIG. 3 is substantially a group of four N-type transistors, and the N-type transistor 23 is substantially a group of two N-type transistors. Therefore, both six N-type transistors in total belonging to these groups selected by both the NAND gates 61, 63, 65 and 67 based on the control signal and the number of N-type transistors indicated by the above-mentioned character "offset" are engaged in the driving of another device connected to the output signal line 130.

As describe above, in the driver circuit 10 shown in FIG. 3, if the control signal designated by the driving capacity given by binary four bits of parallel data when the level of a signal inputted to the signal input line 140 is H, is modified, the number of N-type transistors engaged in the driving of another device connected to the output signal line 130 increases/decreases according to the modification of the control signal. Accordingly, the driving capacity of the driver circuit 10 can be changed. In this case, the number of N-type transistors indicated by the character "offset" has the effect of providing the driving capacity of the driver circuit 10 with offset (shifting the changing range of the driving capacity).

As described above, in the driver circuit 10 shown in FIG. 3, a control signal for designating the driving capacity given as binary four bits of parallel data is modified, the number of driving transistors engaged in the driving of another device connected to the output signal line 130 according to the modification of this control signal. Accordingly, the driving capacity of the driver circuit 10 can be changed. In other words, the driving capacity of the driver circuit 10 can be adjusted.

Here, the driver circuit 10 shown in FIG. 3 is compared with the conventional driver circuit 101 shown in FIG. 2. Except for the number of driving transistors used to provide driving capacity for offset in order to adjust the 16-step (binary four bit) driving capacity, in the conventional driver circuit 101, 60 (=4×(16-1)) driving transistors are provided, whereas in the driver circuit 10 shown in FIG. 3, only 30 (=(8+4+2+1)×2) driving transistors are used. Accordingly, in the driver circuit 10 shown in FIG. 3, circuit scale is widely reduced.

In the driver circuit 10 shown in FIG. 3, the P-type and N-type driving transistors are formed to match the respective driving resistance values. Conventionally, priority was given to the easy layout of a semiconductor substrate, and the respective shapes on the semiconductor substrate of P-type and N-type transistors were made the same. Therefore, the respective driving resistance values of the P-type and N-type transistors are greatly different, and the respective number of the P-type and N-type transistors was also made different. This made the physical connection around a driving transistor on a semiconductor substrate complex. However, in the driver circuit 10 shown in FIG. 3, since the respective driving resistance values of the P-type and N-type transistors are made to be the same, the above-mentioned physical connection becomes easy.

Since in the driver circuit 10 shown in FIG. 3, each driving transistor is individually provided with one pre-driver, the deviation of the driving timing of a driving transistor can be reduced for the reduced load of each pre-driver. As a result, the output (output signal line) slew rate of this driver circuit 10 can also be improved.

Since in the driver circuit 10 shown in FIG. 3, the respective driving resistance values of all driving transistors are the same, the change linearity of the driving capacity of the driver circuit 10 against the change of a control signal can also be improved.

Furthermore, the present invention is not limited to the above-mentioned preferred embodiments, and any variations in and amendments to the present invention are available as long as they do not depart from the subject matter of the present invention.

What is claimed is:

1. A driver circuit, comprising:
   a plurality of driving transistors connected in parallel;
   a selection unit selecting at least one of a plurality of groups, said one of a plurality of groups having a power base of two number of driving transistors with the same polarity, and with a different power base of two number of driving transistors from another of said plurality of groups;
   a driving unit selectively driving said driving transistors belonging to the group selected by the selection unit up to a combination of the selected power base of two number of driving transistors; and
   an offset driving unit driving a plurality of driving transistors not belonging to the plurality of groups, to drive another device connected to the driver circuit, and
   wherein the driving unit comprises a plurality of pre-drivers, with each one of said plurality of pre-drivers connected to a respective one of said plurality of driving transistors.

2. The driver circuit according to claim 1, wherein said driving transistors are P-channel type metal oxide semiconductor (MOS) transistors connected in parallel between a power supply line and an output signal line and N-channel type MOS transistors connected in parallel between a ground line and the output signal line, and the P-channel type MOS transistors and the N-channel type MOS transistors are formed to match the respective driving resistance values.

3. A semiconductor device including a driver circuit, wherein said driver circuit comprises:
a plurality of driving transistors connected in parallel;
a selection unit selecting at least one of a plurality of groups, said one of a plurality of groups having a power base of two number of driving transistors with the same polarity, and with a different power base of two number of driving transistors from another of said plurality of groups; and
a driving unit selectively driving driving transistors belonging to the group selected by the selection unit up to a combination of the selected power base of two number of driving transistors,
said driver circuit is formed on a single semiconductor substrate; and
an offset driving unit driving a plurality of driving transistors not belonging to the plurality of groups, to drive another device connected to the driver circuit, and
wherein the driving unit comprises a plurality of pre-drivers, with each one of said plurality of pre-drivers connected to a respective one of said plurality of driving transistors.

4. The semiconductor device according to claim 3, wherein
said plurality of driving transistors are P-channel type metal oxide semiconductor (MOS) transistors connected in parallel between a power supply line and an output signal line, and N-channel type MOS transistors connected in parallel between a ground line and the output signal line, and the P-channel type MOS transistors and the N-channel type MOS transistors are formed to match the respective driving resistance values, and
the respective driving resistance values of one of said P-channel type MOS transistors and one of said N-channel type MOS transistors are made the same by differentiating their respective sizes on the semiconductor substrate.

5. An electronic device including a semiconductor device with a driver circuit, wherein
said driver circuit comprises
a plurality of driving transistors connected in parallel;
a selection unit selecting at least one of a plurality of groups, said one of a plurality of groups having a power base of two number of driving transistors with the same polarity, and with a different power base of two number of driving transistors from another of said plurality of groups; and
a driving unit selectively driving driving transistors belonging to the group selected by the selection unit up to a combination of the selected power base of two number of driving transistors,
said driver circuit is formed on a single semiconductor substrate; and
an offset driving unit driving a plurality of driving transistors not belonging to the plurality of groups, to drive another device connected to the driver circuit, and
wherein the driving unit comprises a plurality of pre-drivers, with each one of said plurality of pre-drivers connected to a respective one of said plurality of driving transistors.

6. The electronic device according to claim 5, wherein
said plurality of driving transistors are P-channel type metal oxide semiconductor (MOS) transistors connected in parallel between a power supply line and an output signal line, and N-channel type MOS transistors connected in parallel between a ground line and an output signal line, and the P-channel type MOS transistors and the N-channel type MOS transistors are formed to match the respective driving resistance values, and
the respective driving resistance values of each of said P-channel type MOS transistors and each of said N-channel type MOS transistors are made the same by differentiating their respective sizes on the semiconductor substrate.

7. A driver circuit, comprising:
a plurality of driving transistors connected in parallel;
selection means for selecting at least one of a plurality of groups, said one of a plurality of groups having a power base of two number of driving transistors with the same polarity, and with a different power base of two number of driving transistors from another of said plurality of groups;
driving means for selectively driving said driving transistors belonging to the group selected by the selection means up to a combination of the selected power base of two number of driving transistors; and
offset driving means for driving a plurality of driving transistors not belonging to the plurality of groups, to drive another device connected to the driver circuit, and
wherein the driving unit comprises a plurality of pre-drivers, with each one of said plurality of pre-drivers connected to a respective one of said plurality of driving transistors.

8. A driver circuit, comprising:
a selection unit selecting at least one of a plurality of groups, said one of a plurality of groups with a base 2 to the nth. power number of driving transistors with the same polarity connected in parallel;
a driving unit selectively driving said driving transistors belonging to the group selected by the selection unit up to a combination of the selected power base of two number of driving transistors; and
an offset driving unit driving a plurality of driving transistors not belonging to the plurality of groups, allowing a shift of a changing range of a driving capacity, and
wherein the driving unit comprises a plurality of pre-drivers, with each one of said plurality of pre-drivers connected to a respective one of said plurality of driving transistors.

9. A driver circuit, comprising:
a selection unit selecting at least one of a plurality of groups of driving transistors;
a driving unit selectively driving said transistors selected by the selection unit up to a combination value corresponding to a power base of two number of driving transistors; and
an offset driving unit driving a plurality of driving transistors not belonging to the plurality of groups of driving transistors, and
wherein
the driving unit comprises a plurality of pre-drivers, with each one of said plurality of pre-drivers connected to a respective one of said plurality of driving transistors, and
the plurality of groups of driving transistors receive a power supply signal and ground control signal separate from the plurality of driving transistors not belonging to the plurality of groups of driving transistors.

* * * * *